(12) United States Patent
Billiet et al.

(10) Patent No.: US 11,422,468 B2
(45) Date of Patent: Aug. 23, 2022

(54) EFFERVESCENT DEVELOPER PRECURSOR FOR PROCESSING A LITHOGRAPHIC PRINTING PLATE PRECURSOR

(71) Applicant: AGFA NV, Mortsel (BE)

(72) Inventors: Thomas Billiet, Mortsel (BE); Sam Verbrugghe, Mortsel (BE)

(73) Assignee: AGFA NV, Mortsei (BE)

( * ) Notice: Subject to any disclaimer, the term of this patent is extended or adjusted under 35 U.S.C. 154(b) by 0 days.

(21) Appl. No.: 17/282,243

(22) PCT Filed: Sep. 25, 2019

(86) PCT No.: PCT/EP2019/075834
§ 371 (c)(1),
(2) Date: Apr. 1, 2021

(87) PCT Pub. No.: WO2020/074258
PCT Pub. Date: Apr. 16, 2020

(65) Prior Publication Data
US 2021/0356869 A1 Nov. 18, 2021

(30) Foreign Application Priority Data
Oct. 8, 2018 (EP) .................................... 18199040

(51) Int. Cl.
*G03F 7/32* (2006.01)
(52) U.S. Cl.
CPC .................................... *G03F 7/322* (2013.01)
(58) Field of Classification Search
CPC .................................... G03F 7/32; G03F 7/322
See application file for complete search history.

(56) References Cited

U.S. PATENT DOCUMENTS

| | | | |
|---|---|---|---|
| 2003/0170306 A1* | 9/2003 | Raether | C08F 293/00 424/484 |
| 2005/0079451 A1* | 4/2005 | Doan | G03F 7/322 430/327 |
| 2010/0081090 A1* | 4/2010 | Arimura | B41C 1/1008 430/302 |
| 2014/0271492 A1* | 9/2014 | Bartley | A61K 31/4468 424/43 |

FOREIGN PATENT DOCUMENTS

| | | |
|---|---|---|
| EP | 1434102 A1 | 6/2004 |
| EP | 1524113 A2 | 4/2005 |
| EP | 1854627 A1 | 11/2007 |
| JP | 2005153644 A | 6/2005 |
| WO | 2014/145285 A1 | 9/2014 |

OTHER PUBLICATIONS

International Search Report dated Jan. 14, 2020 relating to PCT/EP2019/075834, 3 pages.
Written Opinion dated Jan. 14, 2020 relating to PCT/EP2019/075834, 5 pages.

* cited by examiner

*Primary Examiner* — Chanceity N Robinson
(74) *Attorney, Agent, or Firm* — Leydig, Voit & Mayer, Ltd.

(57) ABSTRACT

An effervescent developer precursor for preparing a developing solution for developing a lithographic printing plate precursor including an effervescence generating compound.

9 Claims, 1 Drawing Sheet

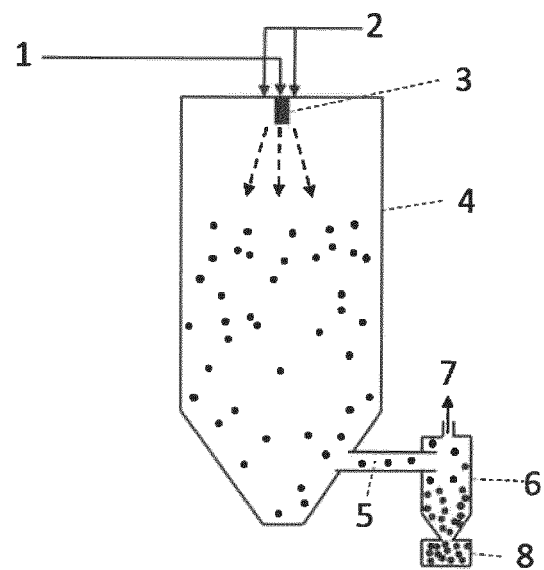

EFFERVESCENT DEVELOPER PRECURSOR FOR PROCESSING A LITHOGRAPHIC PRINTING PLATE PRECURSOR

REFERENCE TO RELATED APPLICATIONS

This application is a 371 National Stage Application of PCT/EP2019/075834, filed Sep. 25, 2019, which claims the benefit of European Application No. 18199040.9, filed Oct. 8, 2018, the contents of which are incorporated by reference herein in their entirety.

TECHNICAL FIELD

The invention relates to an effervescent developer precursor for processing a printing plate precursor.

BACKGROUND ART

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of photopolymer oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Lithographic printing masters are generally obtained by the image-wise exposure and processing of a radiation sensitive layer on a lithographic support. Imaging and processing renders the so-called lithographic printing plate precursor into a printing plate or master. Image-wise exposure of the radiation sensitive coating to heat or light, typically by means of a digitally modulated exposure device such as a laser, triggers a (physico-)chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or difference in rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, hence printing areas of the plate while the hydrophilic support is revealed by the dissolution of the coating in the developer at the non-printing areas.

Conventionally, a plate material is developed by applying a developer solution—for example by immersing it in, or spraying it with a developer—as it passes through the processing apparatus. Typically the material is also subjected to mechanical rubbing with e.g. one or more rotating brushes or specified roller(s)—after a while or after being treated with the developer.

After development, the plate is typically rinsed with water to remove any remaining developer and then gummed. Gumming, sometimes also called finishing or desensitizing, involves the application of a protective coating on the lithographic image, especially the non-printing areas, to avoid contamination or oxidation of the aluminum substrate. Gum solution can be applied by immersion, by spraying or by jetting as disclosed for example in EP 1 524 113.

An important trend in lithographic platemaking is related to ecology and sustainability. Systems and methods which enable a low consumption of processing liquids such as developer, rinse water and/or gum solution, or which allow processing with aqueous developers comprising no hazardous chemicals and/or which have a pH close to 7 (neutral developer), have attracted a lot of attention in the marketplace. A convenient method which has become popular involves the use of a gum solution as developer, whereby the plate is developed and gummed in a single step.

During processing the developer becomes loaded with components of the coating that have been removed during development and the amount of material in the developer increases as more plates are developed. Due to the increasing amount of dissolved and/or dispersed material in the developer, the activity of the developer decreases resulting in a reduced ability of removing the non-printing areas of the lithographic image. In addition, the activity of the developer which is typically applied from an open vessel, may further decrease with time due to dissolution of carbon dioxide from the atmosphere into the developer. Especially silicate free developers which come into contact with air are more sensitive towards such carbonisation. As a result, the efficiency of the developer highly reduces as soon as the recipient containing such a developer is opened. If the period of time before the developer in the processor needs renewal is too long, fresh developer in the recipient under the processor may have become out of specification due to such carbonisation. A solution provided in the art includes for example the use of flexible packaging which avoid air contact with the developer. However, flexible packaging is more expensive than commonly used containers. Alternatively, packaging which contains the adjusted amount of developer required to fill only one tank has been suggested, however, too many packaging sizes would be required.

Nowadays, developers and/or gumming solutions are prepared and then shipped worldwide whereby transportation has a major negative impact on both economy and ecology.

EP 1 434 102 discloses a silicate-free development composition for photosensitive printing plates which is in the form of a paste, powder or granules.

JP2005/153644 discloses a method for processing a photosensitive printing plate including the step of dissolving a solified developer. The solidified developer only dissolves in a liquid upon agitating and/or churning of the liquid.

SUMMARY OF INVENTION

It is an object of the present invention to provide a solidified developer which is able to completely dissolve in a liquid, even without stirring and/or agitating the liquid.

This object is realised by the effervescent developer precursor for preparing a developer solution defined in the independent claims, with preferred embodiments defined in the dependent claims. The invention has the specific feature that the effervescent developer precursor includes an effervescence generating compound and dissolves sufficiently fast and homogenously into a liquid without the need for stirring and/or agitation. The effervescent developer precursor may be used for instant preparation of a developing solution and/or for regeneration of a development solution during processing. The use of the effervescent developer precursor highly contributes to the reduction of waste liquids and/or required stockroom, makes the processing job less labour intensive and prevents mistakes as the operator needs to handle only one type of developer. Therefore, the current invention is not only convenient and cost-efficient, but is also favorable from an environmental point of view. In addition, transportation, distribution and packaging requirements are less stringent for effervescent developer precursors than for liquids.

It is a further object of the present invention to provide a method for making a developing solution for developing a lithographic printing plate comprising the step of dissolving the effervescent developer precursor in a liquid.

Other features, elements, steps, characteristics and advantages of the present invention will become more apparent from the following detailed description of preferred embodiments of the present invention. Specific embodiments of the invention are also defined in the dependent claims.

BRIEF DESCRIPTION OF THE DRAWING

FIG. 1 is a schematic representation of a typical spray drying equipment.

DESCRIPTION OF EMBODIMENTS

The effervescent developer precursor comprises an effervescence generating compound. The effervescent developer precursor may be in the form of an effervescent powder, an effervescent granule or an effervescent tablet. Dissolution of the effervescent developer precursor in a liquid, results in a solution suitable for developing a lithographic printing plate precursor. The obtained solution is homogeneous without the need for any agitation, stirring, churning or shaking. Effervescence means that upon dissolution of the effervescent developer precursor in a liquid, gasses such as for example carbon dioxide, are formed which enhance the dissolution of the developer precursor. Most preferably the effervescent developer precursor is an effervescent tablet. The effervescent developer precursor is also referred to as "the developer tablet" or the "effervescent tablet". A tablet herein refers to a product obtained by for example compression of ingredients in the form of a powder, viscous liquid, etc. into a dense mass of any shape or form; for example pills, pellets, granules, spherical shapes etc . . . . The shape or form of the dense mass is not limited and may be optimized in order to maximize its dissolution behaviour. Alternatively, the powdered ingredients may first be granulated before being pressed into tablets. The effervescent tablets may be packaged in for example a blister pack, a hermetically sealed package or in any other form of container. Preferably, the package or container is soluble in the liquid wherein the effervescent developer precursor is dissolved. The effervescent tablets may be round, cylindrical, elliptical, or rectangular, and should preferably be thin, most preferably with concave faces to increase their surface area relative to their volume to speed up dissolution.

The effervescent developer precursor dissolves in a liquid and typically release one or more gasses. The effervescence generating compound preferable comprises a base component and an acid component that produce a gaseous product upon dissolution and/or chemical reaction. Any base component and acid component that form gasses upon dissolution may be used and/or combined. Carbon dioxide is typically formed as gaseous product. Sodium carbonate, sodium hydrogen carbonate, potassium carbonate, potassium hydrogen carbonate and calcium carbonate are preferred base components. As an acid component sodium citrate, citric acid, tartaric acid, and ascorbic acid are preferred. Any combination of these base component and acid component is suitable. For example, sodium carbonate or potassium carbonate and tartaric acid, sodium carbonate or potassium carbonate and ascorbic acid, potassium hydrogen carbonate and citrate, potassium hydrogen carbonate and citric acid, potassium hydrogen carbonate and tartaric acid and/or potassium hydrogen carbonate and ascorbic acid. Most preferred is a mixture of sodium hydrogen carbonate and citric acid.

The amount of effervescence generating compound in the effervescent developer precursor is preferably from 1 to 90% wt; more preferably from 2 to 75% wt and most preferably from 5 to 65% wt or from 10 to 50% wt.

Optionally, the effervescent developer precursor further comprises one or more sequestering agents—such as sodium sequicarbonate—, and/or dissolution accelerators—such as sodium tripolyphosphate—, and/or tableting lubricants—such as magnesium stearate. Preferably, the sequestering agents, dissolution accelerators and/or tableting lubricants optionally present in the effervescent developer precursor may be independently present in an amount from 0.1 to 30% wt based on the total dry weight of the composition of the precursor. Preferably they are independently present between 1 and 30% by weight, more preferably between 5 and 25% by weight, most preferably between 10 and 20% by weight.

The effervescent developer precursor is preferably used for processing a printing plate precursor by dissolving it in a liquid so that a developing solution obtaining the desired concentration is obtained. The obtained solution is referred to herein as "the developing solution". The optimal concentration of additives in the developing solution mainly depends on the amount of m$^2$ printing plates to be developed and the type of printing plate precursor. Therefore, the additive composition of the effervescent developer precursor preferably depends on the type of precursor to be developed. Preferably the amount of additives in the developing solution is about 0.5 to 20% wt, more preferably about 1.0 to 15% wt, and most preferably about 2 to 10% wt. The amounts of components given below for the different developers are suitable for most applications. However, it is up to the person skilled in the art to adapt the concentration and/or additive composition of the effervescent developer precursor and/or developing solution, to the type of precursor used.

A replenishing solution may be prepared by dissolving the effervescent developer precursor in a liquid to the desired, preferably higher, concentration compared to the developing solution, followed by adding it to the developing solution in use.

The liquid to which the effervescent tablet is added may be a solvent such as an organic solvent or an aqueous solution. Suitable organic solvents are for example phenol ethoxylates, phenol propoxylates, phenoxyethanol, benzyl alcohol, diethylene glycol, and propylene glycol with alkyl groups having six or fewer carbon atoms. More preferably the liquid is water such as demineralized or deionized water and tap water. Most preferably the liquid is tap water.

Developing Solutions

Alkaline Developer

In a first preferred embodiment, the developing solution is alkaline and the additive composition of the effervescent developer precursor comprises, besides the effervescence generating compound, at least one alkaline agent. Positive-working plate precursors typically require a highly alkaline developer, i.e. an aqueous solution which has a pH of at least 10, more typically at least 12, preferably from 13 to 14. The at least one alkaline agent is preferably selected from an alkali metal silicate, such as lithium silicate, sodium silicate, and/or potassium silicate. Sodium silicate and potassium silicate are preferred, and sodium silicate is most preferred. A mixture of alkali metal silicates may be used if desired. Especially preferred alkali metal silicates are silicates having a $SiO_2$ to $M_2O$ weight ratio of at least of at least 0.3, in which M is the alkali metal. Preferably, the ratio is from 0.3 to 1.2. More preferably, it is from 0.6 to 1.1, and most preferably, it is from 0.7 to 1.0.

The amount of alkali metal silicate in the developing solution is typically at least 20 g of $SiO_2$ per 1000 g of developing solution (that is, at least 2 wt %) and preferably from 20 g to 80 g of $SiO_2$ per 1000 g of developing solution (2-8 wt %). More preferably, it is 40 g to 65 g of $SiO_2$ per 1000 g of developing solution (4-6.5 wt %).

In addition to, or as an alternative for the alkali metal silicate, the at least one alkaline agent may be selected from any suitable base, such as, for example, ammonium hydroxide, sodium hydroxide, lithium hydroxide, potassium hydroxide and/or organic amines, and/or mixtures thereof. A preferred base is sodium hydroxide.

Suitable compositions of alkaline developers for positive plate materials have been described in e.g. US 2005/0162505.

Developer Based on Non-Reducing Sugars

A suitable alternative developing solution for processing positive plates comprises a non-reducing sugar and a base, as described in EP 1 403 716, and the additive composition of the effervescent developer precursor comprises, besides the effervescence generating compound, at least one non-reducing sugar and an additional base. Such alkaline developer solutions preferably have a pH above 9, more preferably above 10, and most preferably above 12. The term "non-reducing sugar" means a saccharide which is free of free aldehyde or ketone group and thus is not reducing, e.g. trehalose type oligosaccharides, glycosides and sugar alcohols obtained by hydrogenating and reducing saccharides. Examples of the trehalose type oligosaccharides include saccharose, and trehalose. Examples of the glycosides include alkyl glycoside, phenol glycoside, and mustard oil glycoside. Examples of the sugar alcohols include D, L-arabitol, ribitol, xylitol, D,L-sorbitol, D,L-mannitol, D,L-iditol, D,L-talitol, dulcitol, and arodulicitol. Further, maltitol obtained by the hydrogenation of disaccharide or reduced material (reduced starch sirup) obtained by the hydrogenation of oligosaccharide may be used. Preferred among these non-reducing sugars are sugar alcohols and saccharose. Even more desirable among these non-reducing sugars are D-sorbitol, saccharose, and reduced starch sirup because they have buffer action within a proper pH range.

These non-reducing sugars may be used alone or in combination of two or more thereof. The proportion of these non-reducing sugars in the developing solution is preferably from 0.1 to 30% by weight, more preferably from 1 to 25% by weight.

The aforementioned non-reducing sugar may be used in combination with an alkaline agent as a base, properly selected from the group consisting of known materials such as inorganic alkaline agents, e.g. sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate, potassium citrate, tripotassium citrate, and sodium citrate.

Further preferred examples of alkaline agents include organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkaline agents may be used singly or in combination of two or more thereof. Preferred among these alkaline agents are sodium hydroxide, potassium hydroxide, trisodium phosphate, tripotassium phosphate, sodium carbonate and potassium carbonate.

Silicate-Free and Sugar-Free Developer

A silicate-free and sugar-free alkaline developing solution, as described in US2012/0129033, has a pH of at least 12 and the additive composition of the effervescent developer precursor preferably comprises, besides the effervescence generating compound, (a) a hydroxide, (b) a metal cation M2' selected from barium, calcium, strontium, and zinc cations, (c) a chelating agent for the metal cation $M^+$ and (d) an alkali metal salt different than all of a, b, and c above.

The developing solutions described above may include further ingredients such as antifoaming agents, biocides, corrosion inhibitors, chelating agents, anionic, non-ionic and/or amphoteric surfactants (up to 3% on the total composition weight), image protecting agents such as blockers or retardants, dissolution inhibitors and thickening agents such as water soluble or water dispersible polyhydroxy compounds such as glycerine or polyethylene glycol.

Suitable antifoaming agents are for example Silicone Antifoam emulsion SE57 (Wacker), TRITON® CF32 (Rohm & Haas), AKYPO® LF2 (ether carbonic acid, ChernY), Agitan 190 (MOnzing Chemie), TEGO® Foamese 825 (modified polysiloxane, TEGO Chemie Service GmbH, DE). Silicone-based antifoaming agents are preferred. They can be either emulsion-dispersible or soluble in water. The amount of antifoaming agents in the developing solution is typically 0 to 5% by weight, more preferably about 0.1 to 4% by weight; most preferably about 0.5 to 3 wt by weight. It is possible to use a single antifoaming agent or a combination of two or more thereof.

The biocide prevents occurrence of bacteria, fungi and/or yeasts. Suitable biocides are N-methylol-chloroacetamide, benzoic acid, phenol or its derivatives, formalin, imidazole derivatives, sodium dehydro-acetate, isothiazolinone derivatives, benzotriazole derivatives, amidines, guanidine derivatives, quaternary ammonium salts, pyridine, quinoline derivatives, diazine, triazole derivatives, oxazoles and oxazine derivatives, and mixtures thereof. Depending on the kind of bacteria, fungi and/or yeasts, the developing solution may include 0 to 10% wt, more preferably about 0.1 to 5% wt and most preferably about 0.2 to 2% wt of biocide. It is possible to use a single biocide or a mixture of two or more.

Suitable examples of corrosion inhibitors are magnesium nitrate, zinc nitrate, calcium nitrate, sodium nitrate, potassium nitrate, lithium nitrate, ammonium nitrate and mixtures thereof. They are typically used in the developing solution in an amount of 0 to 10% by weight, more preferably of 0.5 to 10% by weight and most preferably of 1 to 5% by weight. The inhibitors can be used individually or as a mixture of two or more thereof.

Examples of suitable chelating agents include aminopolycarboxylic acid and salts thereof (organic amine salts, potassium and sodium salts) such as ethylenediamine-tetraacetic acid, diethylenetriamine-pentaacetic acid, triethylenetetramine-hexaacetic acid, hydroxyethyl ethylenediamine-triacetic acid, nitrilotriacetic acid, 1,2-diaminocyclohexane-tetraacetic acid and 1,3-diamino-2-propanol tetraacetic acid; and an organophosphonic acid, phosphonoalkane tricarboxylic acid such as 2-phosphono-butanetricarboxylic acid-1,2,4, 2-phosphono-butane-tricarboxylic acid-2,3,4; 1-phosphono-ethane-tricarboxylic acid-2,2,2, aminotris-(methylene-phosphonic acid) and alkali gluconates such as sodium gluconate. The chelating agents can be used singly or in combination of two or more thereof. These chelating agents are generally used in the developing solution in an amount ranging from 0 to 30% by weight, more preferably about 0.1 to 20% by weight, most preferably about 3 to 10% by weight.

Suitable surfactants include anionic surfactants like fatty acid salts, abietic acid salts, hydroxyalkanesulfonic acid salts, dialkyl sulfosuccinate salts, alkyl naphthalene-sulfonate salts, alkyl-phenoxy polyoxyethylenepropylsulfonate salts, polyoxyethylene alkylsulfophenyl ether salts, sodium salt of N-methyl-N-oleyl-taurine, disodium salt of N-alkylsulfosuccinic acid amide, petroleum sulfonic acid salts, sulfated castor oil, sulfated tallow, sulfuric acid ester salts of 20 fatty acid alkyl esters, alkylsulfate ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkylphosphate ester salts, polyoxyethylene alkyl ether phosphoric acid ester salts, polyoxyethylene alkylphenyl ether phosphoric acid ester salts, partially saponified styrene-maleic anhydride copolymers, partially saponified olefin-maleic anhydride copolymers and condensates of naphthalene sulfonic acid salt and formalin; alkylbenzene sulfonates, alkane sulfonates, alkylsulfates and alkylethersulfates, non ionic surfactants like glycerin, ethylene glycol, triethylene glycol, sorbitan fatty acid ester, alkyl phenolethoxylates, fatty alcohol ethoxylates, alkyl polyglucosides and N-methylglucamides; and cationic surfactants like quaternary ammonium compounds with one or two hydrophobic groups and salts of long chain primary amines.

The surfactants are preferably used in the developing solution in an amount of 0 to 50 wt %, more preferably about 0.5 to 35 wt %, most preferably about 5 to 20 wt %. Besides the use of a single surfactant, it is also possible to use a combination of two or more thereof.

Gum Developer

In a highly preferred embodiment, the developing solution is a gum solution and the additive composition of the effervescent developing precursor comprises, besides the effervescence generating compound, at least one or more surface protective compounds that are capable of protecting the lithographic image of a printing plate against contamination, e.g. by oxidation, fingerprints, fats, oils or dust, or damaging, e.g. by scratches during handling of the plate. During the development step using such a developing solution, the non-image areas are removed and the plate is gummed in a single step. The development with a gum solution has the additional benefit that, due to the remaining gum on the plate in the non-exposed areas, an additional gumming step is not required to protect the surface of the support in the non-printing areas. As a result, the precursor is processed and gummed in one single step which involves a less complex developing apparatus than a developing apparatus comprising a developer tank, a rinsing section and a gumming section. The gumming section may comprise at least one gumming unit or may comprise two or more gumming units. These gumming units may have the configuration of a cascade system, i.e. the gum solution, used in the second gumming unit and present in the second tank, overflows from the second tank to the first tank when gum replenishing solution is added in the second gumming unit or when the gum solution in the second gumming unit is used once-only, i.e. only starting gum solution is used to develop the precursor in this second gumming unit by preferably a spraying or jetting technique. More details concerning such gum development is described in EP1 788 444.

The layer that remains on the plate after treatment with the gum solution preferably comprises between 0.005 and 20 g/m$^2$ of the surface protective compound, more preferably between 0.010 and 10 g/m$^2$, most preferably between 0.020 and 5 g/m$^2$. As the developed plate precursor is developed and gummed in one step, there is no need to post-treat the processed plate.

The gum solution preferably has a pH value between 3 and 11, more preferably between 4 and 10, even more preferably between 5 and 9, and most preferably between 6 and 8. A suitable gum solution is described in for example EP 1 342 568 in [0008] to [0022] and WO2005/111727 (page 6 line 5 till page 11 line 30).

Suitable examples of surface protective compounds are film-forming hydrophilic polymers or surfactants. Preferred polymers for use as protective compound in the gum solution are gum arabic, pullulan, cellulose derivatives such as carboxymethylcellulose, carboxyethylcellulose or methylcellulose, (cyclo)dextrin, poly(vinyl alcohol), poly(vinyl pyrrolidone), polysaccharide, homo- and copolymers of acrylic acid, methacrylic acid or acrylamide, a copolymer of vinyl methyl ether and maleic anhydride, a copolymer of vinyl acetate and maleic anhydride or a copolymer of styrene and maleic anhydride. Highly preferred polymers are homo- or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropane sulfonic acid.

Examples of surfactants for use as surface protective agent include anionic or nonionic surfactants. The gum solution may also comprise one or more of the above hydrophilic polymers as surface protective agent and, in addition, one or more surfactants to improve the surface properties of the coated layer. The surface tension of the gum solution is preferably from 20 to 50 mN/m. The gum solution and/or the effervescent tablet comprises, besides the effervescence generating compound, at least one or more comprises preferably an anionic surfactant, more preferably an anionic surfactant whereof the anionic group is a sulphonic acid group.

Specific examples of suitable anionic surfactants include sodium dodecylphenoxybenzene disulfonate, the sodium salt of alkylated naphthalenesulfonate, disodium methylene-dinaphtalenedisulfonate, sodium dodecyl-benzenesulfonate, sulfonated alkyldiphenyloxide, ammonium or potassium perfluoroalkylsulfonate and sodium dioctyl-sulfosuccinate. Particularly preferred nonionic surfactants are polyoxyethylene alkylphenyl ethers, polyoxyethylene alkylnaphthyl ethers and poloxyethylene-polyoxypropylene block polymers. Further, fluorinic and siliconic anionic and nonionic surfactants may be similarly used.

More details concerning the surface protective compounds in the gum solution can be found in WO 2007/057348 page 9 line 3 to page 11 line 6.

The gum solution may further comprise an inorganic salt, a wetting agent, a buffer, a chelate compound, an antiseptic compound, an anti-foaming compound and/or an ink receptivity agent and/or combinations thereof. More details about these additional ingredients are described in WO 2007/057348 page 11 line 22 to page 14 line 19.

Preparation of the Tablet

Effervescent ingredients as described above are added and mixed with—depending on the desired developing solution—the ingredients as described above. Preferably the mixing is carried out by means of high shear mixing or blending. Tableting is achieved by a compression step whereby the integrity of the ingredients is maintained.

Preparation of Powder

The effervescent tablet may also be prepared by first spray drying a developing solution as described above. Spray drying may be performed by using a typical spray drying equipment and results in a homogenous distribution of the composition. A schematic representation of a typical spray drying equipment is given in FIG. 1. The equipment comprises a heated drying gas inlet (1), an optionally temperature controlled solution or suspension feed inlet (2), a spray nozzle (3), part between (5) drying chamber (4) and cyclone (6), drying gas outlet (7), and collection vessel for the dry product (8).

A typical spray dryer separates a liquid stream into a solute or suspension part and a solvent part and functions as follows. First, a liquid stream is sprayed into a hot vapor stream. The liquid stream vaporizes and the solute or suspension part of the liquid stream forms droplets. Subsequently, moisture leaves the droplets which have been formed and as a result, the solute or suspension part is solidified. The solidified droplets are then collected in a drum or cyclone. A powder is obtained.

The liquid stream is usually sprayed into the hot vapor stream through one or more nozzles. The advantages of using one or more nozzles are that small droplets may be formed, heat transfer between the hot vapor stream and the liquid stream may be maximized and the rate of vaporization may be increased. The type of nozzle determines the droplet size which preferably is contained between 20 and 180 μm. Two types of nozzles are commonly used: high pressure single fluid nozzles which can produce 50 to 300 bar, and two-fluid nozzles including besides the liquid to dry, compressed gas, generally air at 1 to 7 bar.

Effervescent ingredients are subsequently added and mixed with the obtained powder. Preferably, a high shear mixing or blending is used. Tableting is achieved by a compression step whereby the integrity of the ingredients is maintained.

Method of Making the Developing Solution

The invention also relates to a method for making a developing solution including the step of dissolution of the effervescent developer precursor in a liquid. In the embodiment where the effervescent developer precursor is a tablet, at least one tablet is dissolved in the liquid. It was found that the dissolution of the effervescent developer precursor of the present invention is fast, homogenous and does not require any stirring and/or agitation. The liquid is preferably a solvent such as an organic solvent or an aqueous solution. Suitable organic solvents are for example phenol ethoxylates, phenol propoxylates, phenoxyethanol, benzyl alcohol, diethylene glycol, and propylene glycol with alkyl groups having six or fewer carbon atoms. More preferably the liquid is water such as demineralized or deionized water and tap water. Most preferably the liquid is tap water.

Method of Making a Printing Plate

The invention also relates to a method for making a printing plate including the steps of (i) image wise exposing a light and/or heat sensitive lithographic printing plate precursor;

(ii) dissolving at least one effervescent developer precursor in a liquid thereby obtaining a developing solution; in the embodiment where the effervescent developer precursor is a tablet, at least one tablet is dissolved in the liquid;

(iii) applying the developing solution to the exposed plate precursor.

The developing solution may be applied by dipping, immersing, (spin-) coating, spraying, pouring-on, either by hand or in an automatic processing apparatus.

The method can be used for processing any positive or negative working lithographic printing plate that is developed by means of a developing solution. The developer removes the non-image areas of an imagewise exposed printing plate precursor. Depending on the kind of plate (i.e. the ingredients of the light and/or heat sensitive composition) a person skilled in the art is able to select a suitable developer.

The Lithographic Printing Plate Precursor

The lithographic printing plate precursor used in the present invention can be negative or positive working, i.e. can form ink-accepting areas at exposed or at non-exposed areas respectively. Below, the preferred support and suitable examples of heat- and light-sensitive coatings are discussed in detail.

Support

The preferred support of the lithographic printing plate material used in the present invention has a hydrophilic surface or is provided with a hydrophilic layer. A particularly preferred lithographic support is a grained and anodized aluminum support, more preferably aluminum grained by electrochemical graining in a solution comprising nitric acid and/or hydrochloric acid and then electrochemically anodized in a solution comprising phosphoric acid and/or sulphuric acid.

Heat-Sensitive Printing Plate Precursors

The imaging mechanism of the heat-sensitive printing plate precursors can be triggered by direct exposure to heat, e.g. by means of a thermal head, or by the light absorption of one or more compounds in the coating that are capable of converting light, more preferably infrared light, into heat. These heat-sensitive lithographic printing plate precursors are preferably not sensitive to visible light, i.e. no substantial effect on the dissolution rate of the coating in the developer is induced by exposure to visible light. Most preferably, the coating is not sensitive to ambient daylight.

A first suitable example of a thermal printing plate precursor is a precursor based on heat-induced coalescence of hydrophobic thermoplastic polymer particles which are preferably dispersed in a hydrophilic binder, as described in e.g. EP 770 494, EP 770 495, EP 770 497, EP 773 112, EP 774 364, EP 849 090, EP 1 614 538, EP 1 614 539, EP 1 614 540, EP 1 777 067, EP 1 767 349, WO 20061037716, WO 2006/133741 and WO 2007/045515. According to a preferred embodiment, the thermoplastic polymer particles include styrene and acrylonitrile units in a weight ratio between 1:1 and 5:1 (styrene:acrylonitrile), e.g. in a 2:1 ratio. Examples of suitable hydrophilic binders are homopolymers and copolymers of vinyl alcohol, acrylamide, methylol acrylamide, methylol methacrylamide, acrylic acid, methacrylic acid, hydroxyethyl acrylate, hydroxyethyl methacrylate and maleic anhydride/vinylmethylether copolymers.

Preferably such an image-recording layer comprises an organic compound including at least one phosphonic acid group or at least one phosphoric acid group or a salt thereof, as described in WO 2007/04551.

In a second suitable embodiment, the thermal printing plate precursor comprises a coating comprising an aryldiazosulfonate homo- or copolymer which is hydrophilic and soluble in the processing liquid before exposure to heat or UV light and rendered hydrophobic and less soluble after such exposure.

Preferred examples of such aryldiazosulfonate polymers are the compounds which can be prepared by homo- or copolymerization of aryldiazosulfonate monomers with other aryldiazosulfonate monomers and/or with vinyl monomers such as (meth)acrylic acid or esters thereof, (meth) acrylamide, acrylonitrile, vinylacetate, vinylchloride, vinylidene chloride, styrene, α-methyl styrene etc. Suitable aryldiazosulfonate monomers are disclosed in EP-A 339393, EP-A 507008 and EP-A 771645 and suitable aryldiazosulfonate polymers are disclosed in EP 507,008, EP 960,729, EP 960,730 and EP1,267,211.

A further suitable thermal printing plate precursor is positive working and relies on heat-induced solubilization of an oleophilic resin. The oleophilic resin is preferably a polymer that is soluble in an aqueous developer, more preferably an aqueous alkaline development solution with a pH between 7.5 and 14. Preferred polymers are phenolic resins e.g. novolac, resoles, polyvinyl phenols and carboxy substituted polymers. Typical examples of these polymers are described in DE-A-4007428, DE-A-4027301 and DE-A-4445820. The amount of phenolic resin present in the imaging layer is preferably at least 50% by weight, preferably at least 80% by weight relative to the total weight of all the components present in the imaging layer.

In a preferred embodiment, the oleophilic resin is a phenolic resin wherein the phenyl group or the hydroxy group is chemically modified with an organic substituent. The phenolic resins which are chemically modified with an organic substituent may exhibit an increased chemical resistance against printing chemicals such as fountain solutions or plate treating liquids such as plate cleaners. Examples of such chemically modified phenolic resins are described in EP-A 0 934 822, EP-A 1 072 432, U.S. Pat. No. 5,641,608, EP-A 0 982 123, WO 99/01795, EP-A 02 102 446, EP-A 02 102 444, EP-A 02 102 445, EP-A 02 102 443, EP-A 03 102 522. The modified resins described in EP-A 02 102 446, are preferred, especially those resins wherein the phenyl-group of said phenolic resin is substituted with a group having the structure —N=N-Q, wherein the —N=N— group is covalently bound to a carbon atom of the phenyl group and wherein Q is an aromatic group.

Phenolic resins may also be mixed with or replaced by other polymers such as poly(vinyl acetal) resins in order to improve the abrasion resistance of the coating. Preferred poly(vinyl acetal) resins are copolymers comprising acetal moieties and ethylenic moieties as described in WO2014/ 106554, WO2015/158566, WO2015/173231, WO2015/ 189092 and WO2016/001023. Especially preferred poly (vinyl acetale) resins are resins including ethylenic moieties and acetal moieties including an optionally substituted aromatic or heteroaromatic group including at least one hydroxyl group (WO2014/106554), or poly(vinyl acetale) resins including an optionally substituted aromatic or heteroaromatic group are resins including at least one hydroxyl group in ortho or para position relative to an electron withdrawing group (WO2015/158566).

The coating may further comprise a second layer that comprises one or more other binder(s) which is insoluble in water and soluble in an alkaline solution such as an organic polymer which has acidic groups with a pKa of less than 13 to ensure that the layer is soluble or at least swellable in aqueous alkaline developers. This layer is located between the layer described above comprising the oleophilic resin and the hydrophilic support. The binder may be selected from a polyester resin, a polyamide resin, an epoxy resin, a polyimide, an acrylic resin, a methacrylic resin, a styrene based resin, a polyurethane resin or a polyurea resin. The binder may have one or more functional groups. (Co) polymers including a sulfonamide group are preferred. Sulfonamide (co)polymers are preferably high molecular weight compounds prepared by homopolymerization of monomers containing at least one sulfonamide group or by copolymerization of such monomers and other polymerizable monomers. Examples of monomers copolymerized with the monomers containing at least one sulfonamide group include monomers as disclosed in EP 1 262 318, EP 1 275 498, EP 909 657, EP 1 120 246, EP 894 622, U.S. Pat. No. 5,141,838, EP 1 545 878 and EP 1 400 351.

Suitable examples of sulfonamide (co)polymers and/or their method of preparation are disclosed in EP 933 682, EP 982 123, EP 1 072 432, WO 99/63407, EP 1 400 351 and EP 2 159 049. A highly preferred example of a sulfonamide (co)polymer is described in EP 2 047 988 A in [0044] to [0046].

Specific preferred examples of sulphonamide (co)polymers are polymers comprising N-(p-aminosulfonylphenyl) (meth)acrylamide, N-(m-aminosulfonylphenyl) (meth)acrylamide N-(o-aminosulfonylphenyl) (meth)acrylamide and or m-aminosulfonylphenyl (meth)acrylate.

The dissolution behaviour of the coating can be fine-tuned by optional solubility regulating components. More particularly, developability enhancing compounds, development accelerators and development inhibitors can be used. In the embodiment where the coating comprises more than one layer, these ingredients can be added to the first layer and/or to the second layer and/or to an optional other layer of the coating.

Suitable developability enhancing compounds are (i) compounds which upon heating release gas as disclosed in WO 2003/79113, (ii) the compounds as disclosed in WO 2004/81662, (iii) the compositions that comprises one or more basic nitrogen-containing organic compounds as disclosed in WO 2008/103258 and (iv) the organic compounds having at least one amino group and at least one carboxylic acid group as disclosed in WO 2009/85093. More details concerning developability enhancing compounds are described in WO2017/157575 [0066] to [0077].

The coating of the heat-sensitive printing plate precursors described above preferably also contains an infrared light absorbing dye or pigment which, in the embodiment where the coating comprises more than one layer, may be present in the first layer, and/or in the second layer, and/or in an optional other layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214.

The concentration of the IR-dye in the coating is preferably between 0.25 and 15.0% wt, more preferably between 0.5 and 10.0% wt, most preferably between 1.0 and 7.5% wt relative to the coating as a whole.

The coating may further comprise one or more colorant(s) such as dyes or pigments which provide a visible color to the coating and which remain in the coating at the image areas which are not removed during the processing step. Thereby a visible image is formed and examination of the lithographic image on the developed printing plate becomes feasible. Such dyes are often called contrast dyes or indicator dyes.

To protect the surface of the coating of the heat and/or light sensitive printing plate precursors, in particular from mechanical damage, a protective layer may also optionally be applied. The protective layer generally comprises at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts—i.e. less than 5% by weight based on the total weight of the coating solvents for the protective layer—of organic solvents. The thickness of the protective layer can suitably be any amount, advantageously up to 5.0 μm, preferably from 0.1 to 3.0 μm, particularly preferably from 0.15 to 1.0 μm.

Optionally, the coating may further contain additional ingredients such as surfactants, especially perfluoro surfactants, silicon or titanium dioxide particles or polymers particles such as matting agents and spacers.

Any coating method can be used for applying one or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However, it is not necessary (and may not even be possible) to remove all the solvent in the drying step. Indeed, the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at $1/e^2$ of maximum intensity: 5-25 μm), the scan speed and the resolution of the exposure apparatus (i.e. the number of addressable pixels per unit of linear distance, often expressed in dots per inch or dpi; typical value: 1000-4000 dpi).

Light-Sensitive Printing Plate Precursors

In addition to the above thermal materials, also light-sensitive coatings can be used. Typical examples of such plates are the UV-sensitive "PS" plates and the so-called photopolymer plates which contain a photopolymerizable composition that hardens upon exposure to light.

In a particular embodiment of the present invention, a conventional, UV-sensitive "PS" plate precursor is used. Suitable examples of such plates precursors, that are sensitive in the range of 300-450 nm (near UV and blue light), have been discussed in EP 1,029,668 A2. Positive and negative working compositions are typically used in "PS" plate precursors.

The positive working imaging layer preferably comprises an o-naphtoquinonediazide compound (NQD) and an alkali soluble resin. Particularly preferred are o-naphthoquinonediazidosulphonic acid esters or o-naphthoquinone diazidocarboxylic acid esters of various hydroxyl compounds and o-naphthoquinone-diazidosulphonic acid amides or o-naphthoquinone-diazidocarboxylic acid amides of various aromatic amine compounds. Two variants of NQD systems can be used: one-component systems and two-component systems. Such light-sensitive printing plates have been widely disclosed in the prior art, for example in U.S. Pat. No. 3,635,709, J.P. KOKAI No. 55-76346, J.P. KOKAI No. Sho 50-117503, J.P. KOKAI No. Sho 50-113305, U.S. Pat. Nos. 3,859,099; 3,759,711; GB-A 739654, U.S. Pat. No. 4,266, 001 and J.P. KOKAI No. 55-57841.

The negative working layer of a "PS" plate preferably comprises a diazonium salt, a diazonium resin or an aryl-diazosulfonate homo- or copolymer. Suitable examples of low-molecular weight diazonium salts include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazodiphenylamine and formaldehyde. Examples of diazo resins include condensation products of an aromatic diazonium salt as the light-sensitive substance. Such condensation products are described, for example, in DE-P-1 214 086. The light- or heat-sensitive layer preferably also contains a binder e.g. polyvinyl alcohol.

Upon exposure the diazo resins or diazonium salts are converted from water soluble to water insoluble (due to the destruction of the diazonium groups) and additionally the photolysis products of the diazo may increase the level of crosslinking of the polymeric binder or diazo resin, thereby selectively converting the coating, in an image pattern, from water soluble to water insoluble. The unexposed areas remain unchanged, i.e. water-soluble.

In a second suitable embodiment, the light sensitive printing plate precursor is based on a photo-polymerisation reaction and contains a coating comprising a photopolymerisable composition, said layer is also referred to as the "photopolymerisable layer". The coating may include an intermediate layer, located between the support and the photopolymerisable layer. The photopolymerisable composition may include a free radical initiator, a polymerizable compound and optionally a binder. The photopolymerisable layer may further include an infrared absorbing agent. The photopolymerisable layer has a coating thickness preferably ranging between 0.2 and 5.0 g/m², more preferably between 0.4 and 3.0 g/m², most preferably between 0.6 and 2.2 g/m².

The IR absorbing compound optionally present in the coating is preferably an infrared absorbing dye also referred to as IR dye. The infrared absorbing dyes preferably have an absorption maximum above 780 nm up to 1500 nm. Particular preferred dyes are cyanine, merocyanine, indoaniline, oxonol, pyrilium and squarilium dyes. Most preferred are heptamethinecyane dyes. Examples of suitable IR dyes may be found in EP 1 359 008 paragraph [0030] to [0032] including the references cited therein. Other suitable sensitizers are disclosed in U.S. Pat. Nos. 6,410,205, 5,049,479, EP 1 079 276, EP 1 369 232, EP 1 369 231, EP 1 341 040, US 2003/0124460, EP 1 241 002 and EP 1 288 720.

The polymerisable compound is preferably a polymerisable monomer or oligomer including at least one terminal ethylenic group, hereinafter also referred to as "free-radical polymerisable monomer". The polymerisation involves the linking together of the free-radical polymerisable monomers.

Suitable free-radical polymerisable monomers are disclosed in [0042] and [0050] of EP 2 916 171 and are incorporated herein by reference.

The coating may contain any free radical initiator capable of generating free radicals upon exposure directly or in the presence of a sensitizer. Suitable free-radical initiators are described in WO 2005/111727 from page 15 line 17 to page 16 line 11 and EP 1 091 247 and may include for example hexaaryl-bisimidazole compound (HABI; dimer of triaryl-imidazole), aromatic ketones, aromatic onium salts, organic peroxides, thio compounds, ketooxime ester compounds, borate compounds, azinium compounds, metallocene compounds, active ester compounds and further compounds having a carbon-halogen bond.

The photopolymerisable layer may also comprise a co-initiator. Typically, a co-initiator is used in combination with a free radical initiator. Suitable co-initiators for use in the photopolymer coating are disclosed in U.S. Pat. No. 6,410, 205; 5,049,479; EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 3—Photoinitiators for Free Radical and Cationic Polymerisation by K.K. Dietliker—Edited by P.K.T. Oldring-1991-ISBN 0 947798161. Specific co-initiators, as described in EP 107 792, may be present in the photopolymerizable layer to further increase the sensitivity. Preferred co-initiators are disclosed in EP 2 916 171 [0051] and are incorporated herein by reference.

A very high sensitivity can be obtained by including a sensitizer such as for example an optical brightener in the coating. Suitable examples of optical brighteners as sensitizers are described in WO 2005/109103 page 24, line 20 to page 39. Other preferred sensitizers are blue, green or red light absorbing sensitizers, having an absorption spectrum between 450 nm and 750 nm. Useful sensitizers can be selected from the sensitizing dyes disclosed in U.S. Pat. Nos. 6,410,205; 5,049,479; EP 1 079 276, EP 1 369 232, EP 1 369 231, EP 1 341 040, US 2003/0124460, EP 1 241 002 and EP 1 288 720.

The photopolymerizable layer preferably includes a binder. The binder can be selected from a wide series of organic polymers. Compositions of different binders can also be used. Useful binders are described in WO2005/111727 page 17 line 21 to page 19 line 30, EP 1 043 627 in paragraph [0013] and in WO2005/029187 page 16 line 26 to page 18 line 11. Also of interest are particulate binders such as for example homopolymers and copolymers including monomeric units derived from styrene, methylstyrene, acrylonitrile, vinyl acetate, vinyl butyral, vinyl alcohol, acrylamide, methylol acrylamide, methylol methacrylamide, acrylic acid, methacrylic acid, methyl methacyrlate, methyl acrylate, butyl acrylate, butyl methacrylate, polyethylene glycol methacrylate, polyethylene glycol acrylate, polypropylene glycol acrylate, polypropylene glycol methacrylate, hydroxyethyl acrylate, hydroxyethyl methacrylate, hydroxypropyl acrylate, hydroxypropyl methacrylate, and maleic anhydride/vinylmethylether copolymers, optionally containing a reactive functional group such as for example ethylenically unsaturated groups i.e. an acryloyl group, a methacryloyl group, a vinyl group, an allyl group, an isocyanate group, an epoxy group, an amino group, a hydroxyl group, a carboxyl group or an acid anhydride.

The photopolymerisable layer may also comprise particles which increase the resistance of the coating against manual or mechanical damage. The particles may be inorganic particles, organic particles or fillers such as described in for example U.S. Pat. No. 7,108,956. In addition, spacer particles may be added to the coating. More details of suitable spacer particles described in EP 2 916 171 [0053] to [0056] are incorporated herein by reference. The spacer particles may be substituted with one or more reactive groups.

The photopolymerizable layer may also comprise an inhibitor. Particular inhibitors for use in the photopolymer coating are disclosed in U.S. Pat. No. 6,410,205, EP 1 288 720 and EP 1 749 240.

The photopolymerizable layer may further comprise an adhesion promoting compound. The adhesion promoting compound is a compound capable of interacting with the support, preferably a compound having an addition-polymerizable ethylenically unsaturated bond and a functional group capable of interacting with the support. Under "interacting" is understood each type of physical and/or chemical reaction or process whereby, between the functional group and the support, a bond is formed which can be a covalent bond, an ionic bond, a complex bond, a coordinate bond or a hydrogen-bond, and which can be formed by an adsorption process, a chemical reaction, an acid-base reaction, a complex-forming reaction or a reaction of a chelating group or a ligand. The adhesion promoting compounds described in EP 2 916 171 [0058] are incorporated herein by reference.

Various surfactants may be added into the photopolymerisable layer to allow or enhance the developability of the precursor; especially developing with a gum solution. Both polymeric and small molecule surfactants for example non-ionic surfactants are preferred. More details are described in EP 2 916 171 [0059] and are incorporated herein by reference.

The coating may include on the photopolymerisable layer, a toplayer or protective overcoat layer which acts as an oxygen barrier layer including water-soluble or water-swellable binders. Printing plate precursors which do not contain a toplayer or protective overcoat layer are also referred to as overcoat-free printing plate precursors. In the art, it is well-known that low molecular weight substances present in the air may deteriorate or even inhibit image formation and therefore usually a toplayer is applied to the coating. A toplayer should be easily removable during development, adhere sufficiently to the photopolymerisable layer or optional other layers of the coating and should preferably not inhibit the transmission of light during exposure. Preferred binders which can be used in the toplayer are polyvinyl alcohol and the polymers disclosed in WO 2005/

029190; U.S. Pat. No. 6,410,205 and EP 1 288 720, including the cited references in these patents and patent applications. The most preferred binder for the toplayer is polyvinylalcohol. The polyvinylalcohol has preferably a hydrolysis degree ranging between 74 mol % and 99 mol %, more preferably between 88-98%. The weight average molecular weight of the polyvinylalcohol can be measured by the viscosity of an aqueous solution, 4% by weight, at 20° C. as defined in DIN 53 015, and this viscosity number ranges preferably between 2 and 26, more preferably between 2 and 15, most preferably between 2 and 10.

The overcoat layer may optionally include other ingredients such as inorganic or organic acids, matting agents or wetting agents as disclosed in EP 2 916 171 and are incorporated herein by reference.

The coating thickness of the optional toplayer is preferably between 0.10 and 1.75 g/m$^2$, more preferably between 0.15 and 1.3 g/m$^2$, most preferably between 0.20 and 1.0 g/m$^2$. In a more preferred embodiment of the present invention, the optional toplayer has a coating thickness between 0.25 and 1.75 g/m$^2$ and comprises a polyvinylalcohol having a hydrolysis degree ranging between 74 mol % and 99 mol % and a viscosity number as defined above ranging between 3 and 26.

Other ingredients such as colorants, matting agents and/or printing out agents may optionally be added. These printing plate precursors can be sensitized with blue, green or red light (i.e. wavelength range between 450 and 750 nm), with violet light (i.e. wavelength range between 350 and 450 nm) or with infrared light (i.e. wavelength range between 750 and 1500 nm) using for example an Ar laser (488 nm) or a FD-YAG laser (532 nm), a semiconductor laser InGaN (350 to 450 nm), an infrared laser diode (830 nm) or a Nd-YAG laser (1064 nm). Optionally, the coating may further contain additional ingredients such as surfactants, especially perfluoro surfactants, To protect the surface of the coating of the heat and/or light sensitive printing plate precursors, in particular from mechanical damage, a protective layer may also optionally be applied. The protective layer generally comprises at least one water-soluble binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts—i.e. less than 5% by weight based on the total weight of the coating solvents for the protective layer—of organic solvents. The thickness of the protective layer can suitably be any amount, advantageously up to 5.0 μm, preferably from 0.1 to 3.0 μm, particularly preferably from 0.15 to 1.0 μm.

Any coating method can be used for applying two or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However, it is not necessary (and may not even be possible) to remove all the solvent in the drying step. Indeed, the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

EXAMPLES

All materials used in the following examples were readily available from standard sources such as Sigma-Aldrich (Belgium) and Acros (Belgium) unless otherwise specified.

1. Preparation of Powder

Spray drying of the developing solutions Azura TS (gum solution) and THD200 (alkaline developer); both commercially available from Agfa NV; was performed using a typical spray drying equipment.

Azura TS and THD200 were spray dried using a ProCept spray dryer equipment (commercially available from Xedev BVBA). The following process parameters were applied:

the drying air inlet temperature 140° C.;
flow rate of 0.3 m$^3$ per minute;
the drying chamber air outlet temperature was controlled at 70° C.;
the cyclone air inlet temperature 40° C.

Spraying was performed using a bi-fluid nozzle (0.4 mm) at a flow rate of 2 grams per minute and a nozzle air flow rate of 5 liters per minute. A dry powder was obtained.

2. Particle Size Determination

The particle size of the obtained dry powders was analyzed using a Rodos dry dispersing unit (commercially available from Rodos) operating with a vibratory feeder (VIBRI) at a pressure of 3 bar and feed rate of 75%, and a Helos laser diffraction sensor (commercially available from Sympatec GmbH). Evaluation was performed using Windox 5.8.2.0 software, available from Sympatec GmbH.

The obtained spray dried Azura TS gum (Pow-01) resulted in a powder particle size average of 8.8 μm, while for the obtained spray dried THD 200 developer (Pow-02) an average powder particle size of 11.6 μm was obtained.

3. Effervescent Tablets

An amount of citric acid and sodium bicarbonate was mixed with respectively the obtained Azura TS spray dried powder (Pow-01) and the obtained THD200 spray dried powder (Pow-02). These blended mixtures were then transferred to a tablet compressor with a diameter of 25 mm for tablet formation. Different ratios of the citric acid and bicarbonate were used (see Table 1) and the dissolution behaviour was evaluated.

TABLE 1

| | Tablet composition | | | |
|---|---|---|---|---|
| Tablet | Pow-01 g | Pow-02 g | Citric acid g | Sodium bicarbonate g |
| Comp-1 | 7 | — | — | — |
| Inv-1 | 7 | — | 1.22 | 0.52 |
| Inv-2 | 7 | — | 2.1 | 0.9 |
| Inv-3 | 2.2 | — | 0.66 | 0.28 |
| Comp-2 | — | 2.2 | — | — |
| Inv-4 | — | 2.2 | 0.33 | 0.14 |

4. Dissolution Behaviour

The obtained tablets were dissolved in deionized water (Table 2) at 20° C. without mechanical stirring. The dissolution behaviour was visually scored. All the inventive tablets dissolved homogenously without the requirement for any stirring. The results are summarized in Table 2.

TABLE 2

| Gum/developer solution | Tablet | Deionized water g | Dissolution score* |
|---|---|---|---|
| Commercial Azura TS | — | — | — |
| Gum-01 | Comp-1 | 70 | 5 |
| Gum-02 | Inv-1 | 70 | 3 |
| Gum-03 | Inv-2 | 70 | 2 |
| Gum-04 | Inv-3 | 20 | 1 |
| Commercial THD 200 | — | — | — |
| Dev-01 | Comp-2 | 20 | 4 |
| Dev-02 | Inv-4 | 20 | 1 | dissolution behaviour

*The dissolution behaviour was scored as follows:
1: complete dissolution in less than 30 minutes;
2: complete dissolution in less than 60 minutes;
3: complete dissolution in less than 90 minutes;
4: complete dissolution in less than 120 minutes;
5: incomplete dissolution after 120 minutes, mechanical agitation was necessary to homogeneously dissolve the tablet.

The results illustrate that all inventive samples show complete and homogeneous dissolution (Gum-02 to Gum-04 and Dev-02 dissolve within less than 90 minutes) while the dissolution of the comparative examples (Gum-01 takes more than 90 min to dissolve and Dev-01 does not dissolve at all without agitation) in the deionized water is very poor. The results indicate that the effervescent function allows for an efficient distribution of the developer/gum components in the deionized water whereby the need for stirring or heating of the liquid is not required.

5. Printing Plate Preparation

Azura TU

The printing plate precursor Azura TU, commercially available from Agfa Graphics, was image-wise exposed at 160 mJ/cm2 with a Creo Trendsetter, a platesetter having a 40 W infrared laser head (830 nm), operating at 250 rpm and 2400 dpi.

The exposed printing plate precursor was subsequently processed in a lab scale processor (HWP processor) using commercially available Azura TS gum solution, the gum solution obtained after dissolving the tablets Comp-1, Inv-1, Inv-2 and Inv-3, as described in Table 3 below.

Image quality in terms of clean out behaviour was inspected visually after processing with an 8× magnifying loupe, and the 40% dot area coverage (as measured with a GretagMacbeth D19C densitometer, commercially available from GretagMacbeth AG) was used as a measurement for the plate sensitivity.

No differences in image quality and plate sensitivity were observed.

Energy Elite Pro

The printing plate :Energy Elite Pro, commercially available from Agfa Graphics, was image-wise exposed at a range of energy densities with a Creo Trendsetter, a platesetter having a 20 W infrared laser head (830 nm), operating at 140 rpm and 2400 dpi, commercially available from Eastman Kodak Corp. The image had a 50% dot coverage and consisted of a 10 µm×10 µm checkerboard pattern.

The exposed printing plate was then dipped for 18 s at 25° C. in a 250 mL tank filled with THD200, developer commercially available from Agfa Graphics. The same dipping experiment was performed in a tank filled with Comp-02 and Inv-04 as described in Table 3 below.

The printing plate sensitivity was determined on the processed plates as the energy density at which the 10 µm×10 µm checkerboard has a 52% dot area coverage (as measured with a GretagMacbeth D19C densitometer, commercially available from GretagMacbeth AG).

No differences in image quality and plate sensitivity were observed.

6. Results of Clean Out Behaviour

TABLE 3

| Gum/developer solution | Effervescent tablet | Deionized water (g) | Clean out behaviour* |
|---|---|---|---|
| Printing plate Azura TS | | | |
| Commercial Azura TS | — | — | +++ |
| Gum-01 | Comp-1 | 70 | +++ |
| Gum-02 | Inv-1 | 70 | +++ |
| Gum-03 | Inv-2 | 70 | +++ |
| Gum-04 | Inv-3 | 20 | +++ |
| Printing plate Energy Elite Pro | | | |
| Commercial THD 200 | — | — | +++ |
| Dev-01 | Comp-2 | 20 | +++ |
| Dev-02 | Inv-4 | 20 | +++ | clean out behaviour

*Clean out: amount of residues (non image areas) remaining on the support after developing;
+++ clean background, i.e. no remaining residues after processing The results indicate that development by means of the developing solutions prepared from the tablets according to the present invention compared to development with the commercial available developers (Azura TS and THD200) was successful in terms of clean out behaviour with no severe alterations compared to the starting solution.

7. Conclusion

No differences in image quality, plate sensitivity and clean out behaviour were observed between the effervescent developer precursors and the commercial available developers. The effervescent developer precursors dissolve fast and homogeneous and have the same developing capability as the respective reference developers.

The invention claimed is:

1. A method for processing a lithographic printing plate precursor comprising:
dissolving an effervescent developer precursor for preparing a developing solution for developing a lithographic printing plate precursor in a liquid thereby obtaining a developing solution, wherein the effervescent developer precursor comprises an effervescence generating compound; and
applying the developing solution to the lithographic printing plate precursor.

2. The method of claim 1, wherein the effervescent developer precursor is an effervescent powder, an effervescent granule, or an effervescent tablet.

3. The method of claim 1, wherein the effervescence generating compound comprises a base component and an acid component and produces a gaseous product upon one or more dissolution and chemical reaction.

4. The method of claim 3, wherein the base component is selected from the group consisting of sodium carbonate, sodium hydrogen carbonate, potassium carbonate, potassium hydrogen carbonate, calcium carbonate, and combinations thereof.

5. The method of claim 3, wherein the acid component is selected from the group consisting of sodium citrate, citric acid, tartaric acid, ascorbic acid, and combinations thereof.

6. The method of claim 3, wherein the acid component is citric acid and the base component is one or more of sodium hydrogen carbonate and potassium hydrogen carbonate.

7. The method of claim 1, further comprising an alkaline agent selected from the group consisting of alkali metal silicate, ammonium hydroxide, sodium hydroxide, lithium hydroxide, potassium hydroxide, an organic amine, and combinations thereof.

8. The method of claim 1, further comprising one or more surface protective compounds comprising one or more of a film-forming hydrophilic polymer and a surfactant.

9. The method of claim 1, further comprising one or more of an antifoaming agent, a biocide, a corrosion inhibitor, a chelating agent, an anionic surfactant, a non-ionic surfactant, an amphoteric surfactant, an image protecting agent, a dissolution inhibitor, and a thickening agent.

* * * * *